(12) United States Patent
Kazuno et al.

(10) Patent No.: US 8,296,642 B2
(45) Date of Patent: Oct. 23, 2012

(54) SIGNAL JUDGEMENT CIRCUIT, INTEGRATED CIRCUIT DEVICE AND ELECTRONIC EQUIPMENT

(75) Inventors: Masataka Kazuno, Kofu (JP); Kiminori Nakajima, Fujimi (JP)

(73) Assignee: Seiko Epson Corporation (JP)

( * ) Notice: Subject to any disclaimer, the term of this patent is extended or adjusted under 35 U.S.C. 154(b) by 301 days.

(21) Appl. No.: 12/725,744

(22) Filed: Mar. 17, 2010

(65) Prior Publication Data

US 2011/0018586 A1    Jan. 27, 2011

(30) Foreign Application Priority Data

Jul. 21, 2009   (JP) .................................. 2009-170372

(51) Int. Cl.
*G06F 11/00* (2006.01)
(52) U.S. Cl. .......................................... 714/811; 327/20
(58) Field of Classification Search .................. 365/394; 708/207, 322; 340/2.7; 369/44.28; 714/733, 714/718, 811; 327/20
See application file for complete search history.

(56) References Cited

U.S. PATENT DOCUMENTS

| | | | | |
|---|---|---|---|---|
| 4,577,969 A | * | 3/1986 | Tagaya | 356/394 |
| 4,918,636 A | * | 4/1990 | Iwata et al. | 708/207 |
| 5,202,679 A | * | 4/1993 | Tulpule et al. | 340/2.7 |
| 5,245,561 A | * | 9/1993 | Sugiyama | 708/322 |
| 5,901,120 A | * | 5/1999 | Matsui | 369/44.28 |

FOREIGN PATENT DOCUMENTS

| JP | 57-143656 | 9/1982 |
|---|---|---|
| JP | 2006-306166 | 11/2006 |

* cited by examiner

*Primary Examiner* — David Ton
(74) *Attorney, Agent, or Firm* — Harness, Dickey & Pierce, P.L.C.

(57) ABSTRACT

A signal judgement circuit making a judgement on a signal includes: an error signal generation circuit receiving signals via at least four signal lines and outputting an error signal when, of all the received signals, the number of signals taking on a same value does not exceed half of the number of the received signals; and an output selection circuit selecting any one of the received signals and outputting the selected signal.

15 Claims, 13 Drawing Sheets

|  | CASE 1 | CASE 2 | CASE 3 | CASE 4 | CASE 5 | CASE 6 |
|---|---|---|---|---|---|---|
| AB COMPARISON RESULT | GOOD | POOR | POOR | GOOD | GOOD | GOOD |
| AC COMPARISON RESULT | GOOD | POOR | GOOD | POOR | GOOD | POOR |
| AD COMPARISON RESULT | GOOD | POOR | GOOD | GOOD | POOR | POOR |
| BC COMPARISON RESULT | GOOD | GOOD | POOR | POOR | GOOD | POOR |
| BD COMPARISON RESULT | GOOD | GOOD | POOR | GOOD | POOR | POOR |
| CD COMPARISON RESULT | GOOD | GOOD | GOOD | POOR | POOR | GOOD |
| SIGNAL LINE SELECTED BY OUTPUT SELECTION CIRCUIT | A | B | A | A | A | ERROR |

FIG. 4

| | CASE 7 | CASE 8 | CASE 9 | CASE 10 | CASE 11 | CASE 12 |
|---|---|---|---|---|---|---|
| AB COMPARISON RESULT | POOR | GOOD | GOOD | GOOD | GOOD | GOOD |
| AC COMPARISON RESULT | GOOD | POOR | GOOD | GOOD | GOOD | GOOD |
| AD COMPARISON RESULT | GOOD | GOOD | POOR | GOOD | GOOD | GOOD |
| BC COMPARISON RESULT | GOOD | GOOD | GOOD | POOR | GOOD | GOOD |
| BD COMPARISON RESULT | GOOD | GOOD | POOR | GOOD | POOR | GOOD |
| CD COMPARISON RESULT | GOOD | GOOD | GOOD | GOOD | GOOD | POOR |
| SIGNAL LINE SELECTED BY OUTPUT SELECTION CIRCUIT | C | B | B | A | A | A |

FIG. 5

SIGNAL JUDGEMENT CIRCUIT, INTEGRATED CIRCUIT DEVICE AND ELECTRONIC EQUIPMENT

This application claims priority based on Japanese Patent Application No. 2009-170372 filed on Jul. 21, 2009, which is hereby incorporated.

TECHNICAL FIELD

Some embodiments of the present invention relate to signal judgement circuits, integrated circuit devices, electronic equipment, etc.

BACKGROUND ART

As a method for detecting a failure of a memory or a sensor, a majority method is known. Specifically, this method is a method by which the outputs of three memories or sensors are compared with each other, and, when two of three outputs match, two memories or sensors are judged to be normal, and the remaining one is judged to have broken down.

However, when two of three memories or sensors are broken down, sometimes the two broken memories or sensors may be judged to be normal by the majority method. In such a case, failure diagnosis cannot be carried out accurately.

Moreover, when failure diagnosis is carried out on three objects by the majority method, if one of these objects is judged to have broken down, it becomes impossible to carry out failure diagnosis by the majority method by using the remaining two objects. This immediately leads to a system halt. Therefore, when one object is judged to have broken down by failure detection, the objects of diagnosis have to be changed. This makes it impossible to guarantee the system during operation.

SUMMARY OF THE INVENTION

The present invention has been made in view of the problems described above. According to some embodiments of the invention, it is possible to provide a signal judgement circuit, an integrated circuit device, and electronic equipment that enhance robustness and redundancy by making a judgement on signals received via at least four or more signal lines.

The present invention relates to a signal judgement circuit making a judgement on a signal, including: an error signal generation circuit receiving signals via at least four signal lines and outputting an error signal when, of all the received signals, the number of signals taking on a same value does not exceed half of the number of the received signals; and an output selection circuit selecting any one of the received signals and outputting the selected signal.

The error signal generation circuit receives signals via at least four signal lines and outputs an error signal when, of all the received signals, the number of signals taking on a same value does not exceed half of the number of the received signals.

With the error signal generation circuit, when any signal is selected by majority decision based on, for example, the number of signals taking on a normal value and the number of signals taking on an abnormal value, if the number of signal lines is an even number, it is possible to output an error signal when the number of signals taking on a normal value is equal to the number of signals taking on an abnormal value.

When the value of the received signal is either of two values, H/L, for example, the error signal generation circuit may output an error signal when the number of signals which are H is equal to the number of signals which are L.

The output selection circuit selects any one of the received signals and outputs the selected signal.

According to the invention, signals can be received via at least four signal lines, an error signal can be output when, of all the received signals, the number of signals taking on a same value does not exceed half of the number of the received signals, and any one of the received signals can be selected and output.

With this signal judgement circuit, when a method of selecting a signal taking on a normal value by majority decision, for example, is adopted, even when some signals of the signals received via the signal lines do not take on a same value, majority decision is made on the signals from which the signals which have been in a minority by majority decision are removed, whereby the operation can be continuously performed without outputting an error signal while repeating majority decision until the number of signals taking on a same value does not exceed half of the number of the received signals.

Thus, since signals are received via at least four signal lines, it is possible to reduce erroneous judgements made by the signal judgement circuit.

Therefore, as compared with when signals are received via three signal lines and a judgement is made as to whether, of the received signals, the number of signals taking on a same value exceeds two, it is possible to provide the system with redundancy and robustness.

Moreover, in the signal judgement circuit, the signal may be a logic signal.

With this signal judgement circuit, it is possible to make a signal judgement by using a digital circuit.

Furthermore, with this signal judgement circuit, it is possible to make a signal judgement on a smaller circuit scale as compared with when a signal judgement is made by using an analog circuit.

In addition, in the signal judgement circuit, the number of signal lines may be an even number.

With this signal judgement circuit, an error signal is output when the number of signals taking on one value is equal to the number of signals taking one another value. When the number of signal lines is an even number, since a difference between the number of signals taking on a same value and the number of signals which do not take on a same value is two or more, it is possible to make a signal judgement more accurately.

Moreover, in the signal judgement circuit, the output selection circuit may select the signal from the signal lines transmitting the signals which take on a same value and the number of which exceeds half of the number of the received signals, and output the signal.

With this signal judgement circuit, since the output selection circuit selects the signal from the signal lines transmitting the signals which take on a same value and the number of which exceeds half of the number of the received signals, and outputs the signal, it is possible to output a signal having a great likelihood of taking on a correct value.

Furthermore, in the signal judgement circuit, the output selection circuit may select a signal line in accordance with priorities assigned to the signal lines and output a signal received via the selected signal line.

With this signal judgement circuit, the output selection circuit can select a signal line in accordance with priorities from the signal lines transmitting the signals which take on a same value and the number of which exceeds half of the number of the received signals, and output the signal received via the selected signal line.

In addition, in the signal judgement circuit, the error signal generation circuit may make a matching judgement on all combinations of the signal lines as to whether values of the signals match, make a judgement for each signal line as to whether the signal line is an error based on, of combinations including each signal line, the type of combination judged not to match, and output an error signal when the number of signal lines judged to be in error is equal to or greater than half of the number of the signal lines.

With this signal judgement circuit, when there is a signal line judged to be in error, a matching judgement is made by using the values of the signals which have been input via the signal lines from which the signal line judged to be in error is removed, and it can be judged to be in error when, of all the signals, the number of signals taking on a same value does not exceed half of the number of the signals.

Moreover, in the signal judgement circuit, the error signal generation circuit may output an error signal when combinations including each signal line contain a combination which does not have a same judgement result.

With this signal judgement circuit, it is possible to output an error signal even in a case which is not inherently treated as a failure and prevent a signal corresponding to a combination which does not have a same judgement result from being used.

Furthermore, in the signal judgement circuit, at least two given signal lines of the signal lines may be connected to the output selection circuit, and the output selection circuit may select a signal which has been input via any signal line from the given signal lines and output the signal.

With this signal judgement circuit, it is possible to reduce the number of signal lines connected to the output selection circuit. Therefore, there is no need to complicate the circuit configuration, and it is possible to make the circuit scale small.

In addition, the signal judgement circuit may include an error flag generation circuit outputting an error flag based on a change in the error signal in a predetermined period of time.

With this signal judgement circuit, even when an error signal is output for some reasons when an error does not really occur, an error flag is not output when an error signal is not output for predetermined time. This makes it possible to prevent false detection of failures.

Moreover, in the signal judgement circuit, the signal may be output from at least four storage blocks via the signal lines.

The at least four storage blocks may be a case in which, for example, one storing section is divided into at least four storage areas or there may be at least four storing sections. In addition, there may be at least two storing sections, each being divided into at least two storage areas.

With this signal judgement circuit, it is possible to make a failure judgement on the storing section by making a matching judgement based on the signals which are output from the at least four storage blocks.

Furthermore, in the signal judgement circuit, a signal may be received for each bit of data stored in the storage blocks, and an error signal may be output when, of all the received signals, the number of signals taking on a same value does not exceed half of the number of the received signals.

With this signal judgement circuit, it is possible to receive a signal for each bit of data stored in the storage blocks and output an error signal when, of all the received signals, the number of signals taking on a same value does not exceed half of the number of the received signals.

In addition, in the signal judgement circuit, same data may be stored in the storage blocks, and the signal judgement circuit may include a test control circuit performing control so that data which is different from the same data is output to at least one of the signal lines and the data stored in the storage blocks is output to other signal lines.

With this signal judgement circuit, control is performed so that data which is different from the same data stored in the storage blocks is output to at least one of the signal lines, and the data stored in the storage blocks is output to other signal lines. Therefore, there is no need to connect two types of signal lines, a test signal line and a signal line transmitting normal data, to the error signal generation circuit, and it is possible to prevent an increase in the circuit scale.

Moreover, in the signal judgement circuit, the test control circuit may output, in test mode, a storage block selection signal instructing at least one storage block to output the given data, and each storage block may select and output data stored in the storage block and given data which is different from the data stored in the storage block based on the storage block selection signal.

With this signal judgement circuit, it is possible to conduct a test on the error signal generation circuit by using the function of the storage block. This makes it possible to reduce the number of test circuits.

With this signal judgement circuit, it is possible to conduct a test on the error signal generation circuit effectively with not much increase in the circuit scale.

It is an integrated circuit device functioning as any one of the signal judgement circuits described above.

It is electronic equipment functioning as the integrated circuit device described above.

BRIEF DESCRIPTION OF THE DRAWINGS

FIG. 4 is a diagram for explaining a selection method used when the output selection circuit selects a signal line in accordance with priorities.

FIG. 5 is a diagram for explaining a selection method used when the output selection circuit selects a signal line in accordance with priorities when a physically impossible error has occurred.

DETAILED DESCRIPTION

Hereinafter, a preferred embodiment of the invention will be described in detail by using the drawings. It is to be noted that the embodiment described below does not unduly limit the subject matter of the invention described in the claims. In addition, all configurations described below are not necessarily the indispensable constituent requirements of the invention.

1. Signal Judgement Circuit

Figure 1:
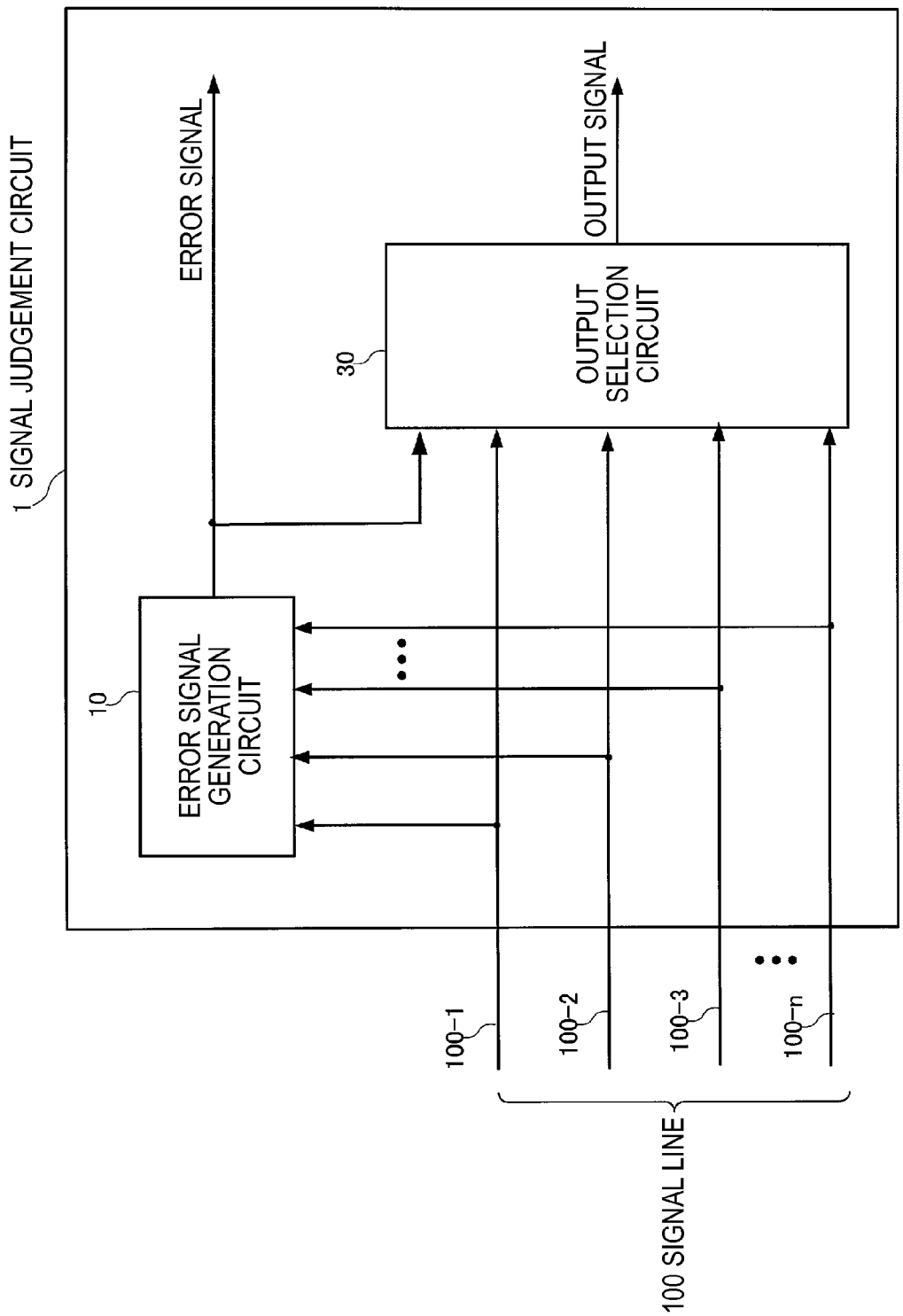
FIG. 1 is a diagram for explaining an example of a configuration of an embodiment of a signal judgement circuit.

FIG. 1 is a diagram for explaining an example of a configuration of an embodiment of a signal judgement circuit.

A signal judgement circuit 1 of this embodiment may include a signal line 100, a judgement circuit 10, and an output selection circuit 30.

The error signal generation circuit 10 receives signals via at least four signal lines 100, and, when, of all the received signals, the number of signals taking on a same value does not exceed half of the number of the received signals, outputs an error signal.

Suppose, for example, there are four signal lines 100. In this case, when the number of signals taking on a same value is four or three, the number of signals taking on a same value exceeds half of the number of the received signals. Therefore, the error signal generation circuit does not output an error signal. However, when the number of signals taking on a same value is two, it is unclear whether the above value or the values of the remaining two signals are correct. In such a case, the error signal generation circuit 10 decides that an error has occurred and outputs an error signal.

The output selection circuit 30 selects any one of the received signals and outputs the selected signal.

The output selection circuit 30 selects any one of the signals received via at least four signal lines 100, and outputs the selected signal. However, even when the error signal generation circuit 10 is outputting an error signal, the output selection circuit 30 can select any one of the received signals and outputs the selected signal.

Moreover, the signal may be a logic signal.

The error signal generation circuit 10 can make a signal judgement by using a digital circuit.

By doing so, it is possible to make a signal judgement on a smaller circuit scale as compared with when a signal judgement is made by using an analog circuit.

Moreover, the number of the signal lines 100 may be an even number.

If the number of the signal lines 100 is an odd number, for example, five, when the ratio of the number of signals taking on one value to the number of signals taking on another value becomes 3:2 or 2:3, the two signals, which are in a minority, may sometimes take on a correct value. However, if the number of the signal lines 100 is an even number, an error signal is output only when the number of signals taking on one value and the number of signals taking on another value are the same in number, making it possible to make a signal judgement more accurately.

Moreover, the output selection circuit 30 may select a signal from the signal lines 100 transmitting the signals which take on a same value and the number of which exceeds half of the number of the received signals, and output the signal.

By doing so, the output selection circuit 30 can output a value of a signal having a great likelihood of taking on a correct value.

2. Signal Error Judgement

Figure 2:
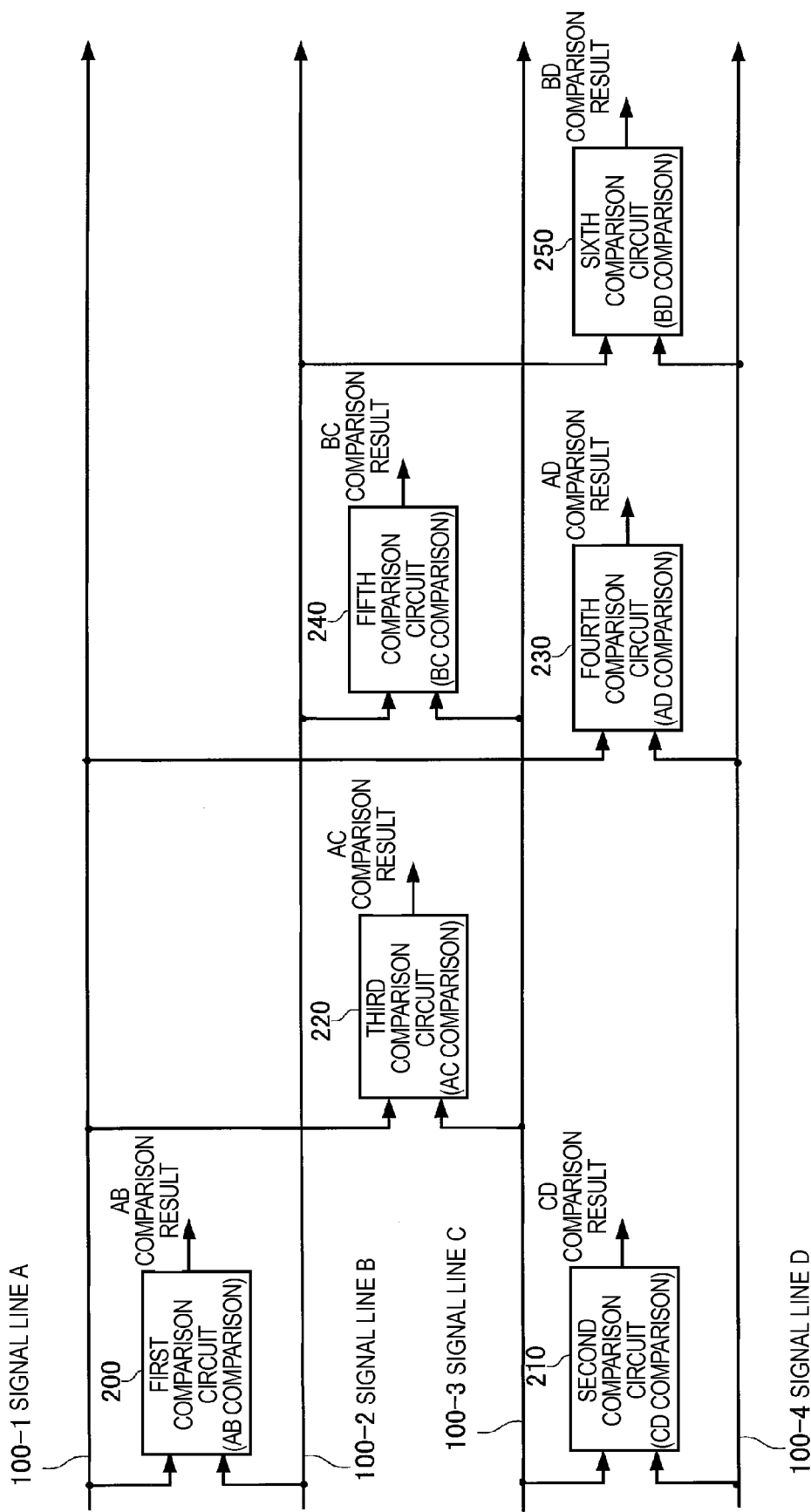
FIG. 2 is a diagram for explaining an example of matching judgement.

FIG. 2 is a diagram for explaining an example of a matching judgement based on all combinations of the signal lines when there are four signal lines.

A signal input via a signal line A100-1 is assumed to be a signal A, a signal input via a signal line B100-2 is assumed to be a signal B, a signal input via a signal line A100-3 is assumed to be a signal C, and a signal input via a signal line D100-4 is assumed to be a signal D.

The error signal generation circuit 10 may make a matching judgement on all combinations of the signal lines as to whether the values of the signals match, make a judgement for each signal line as to whether the signal line is an error based on, of the combinations including each signal line, the type of combination judged not to match, and output an error signal when the number of signal lines judged to be in error is equal to or greater than half of the number of the signal lines.

By doing so, when there is a signal line judged to be in error, a matching judgement is made by using the values of the signals input via the remaining signal lines other than the signal line judged to be in error, and, when, of all the signals, the number of signals taking on a same value does not exceed half of the number of the signals, it can be judged to be in error.

A first comparison circuit 200 makes a matching judgement by comparing the signal A and the signal B to determine whether the signal A and the signal B take on a same value, and outputs an AB comparison result. A second comparison circuit 210 makes a matching judgement by comparing the signal C and the signal D to determine whether the signal C and the signal D take on a same value, and outputs a CD comparison result. A third comparison circuit 220 makes a matching judgement by comparing the signal A and the signal C to determine whether the signal A and the signal C take on a same value, and outputs an AC comparison result. A fourth comparison circuit 230 makes a matching judgement by comparing the signal A and the signal D to determine whether the signal A and the signal D take on a same value, and outputs an AD comparison result. A fifth comparison circuit 240 makes a matching judgement by comparing the signal B and the signal C to determine whether the signal B and the signal C take on a same value, and outputs a BC comparison result. A sixth comparison circuit 250 makes a matching judgement by comparing the signal B and the signal D to determine whether the signal B and the signal D take on a same value, and outputs a BD comparison result.

Figure 3:
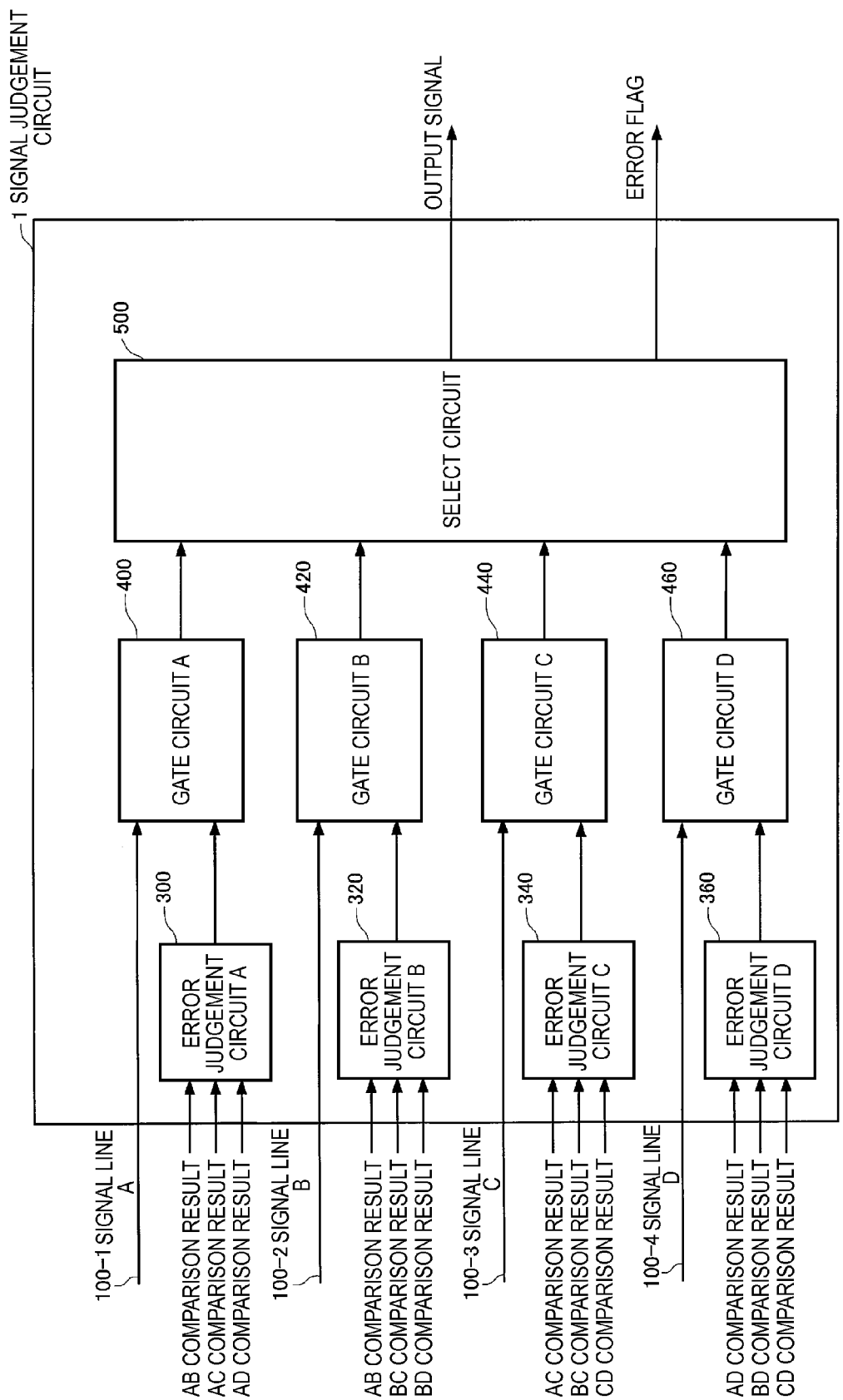
FIG. 3 is a diagram for explaining an example of output selection of an output selection circuit based on an error judgement.

FIG. 3 is a diagram for explaining an example of output selection of the output selection circuit 30 based on an error judgement.

An error judgement circuit A300 makes a judgement as to whether the signal A is an error based on the AB comparison result, the AC comparison result, and the AD comparison result. An error judgement circuit B320 makes a judgement as to whether the signal B is an error based on the AB comparison result, the BC comparison result, and the BD comparison result. An error judgement circuit C340 makes a judgement as to whether the signal C is an error based on the AC comparison result, the BC comparison result, and the CD comparison result. An error judgement circuit D360 makes a judgement as to whether the signal D is an error based on the AD comparison result, the BD comparison result, and the CD comparison result.

To a gate circuit A400, the judgement result of the error judgement circuit A300 and the signal A are input, and the gate circuit A400 outputs the signal A based on the judgement result. To a gate circuit B420, the judgement result of the error judgement circuit B320 and the signal B are input, and the gate circuit B420 outputs the signal B based on the judgement result. To a gate circuit C440, the judgement result of the error judgement circuit C340 and the signal C are input, and the gate circuit C440 outputs the signal C based on the judgement result. To a gate circuit D460, the judgement result of the error judgement circuit D360 and the signal D are input, and the gate circuit D460 outputs the signal D based on the judgement result.

A select circuit 500 selects any one of the signals input via the gate circuits and outputs the selected signal. Moreover, the select circuit 500 may output an error flag.

The select circuit 500 may be formed of a logic gate circuit such as an OR circuit or an AND circuit.

The gate circuits A400 to D460 and the select circuit 500 function as the output selection circuit 30.

The error judgement circuits A300 to D360 and the gate circuits A400 to D460 function as the error signal generation circuit 10. The select circuit 500 receives signals via at least four signal lines, and outputs an error signal when the number of signal lines judged to be in error is equal to or more than half of the number of the signal lines.

FIG. 4 is a diagram explaining a selection method used when the output selection circuit 30 selects a signal line in accordance with priorities assigned to the signal lines.

Case 1 is a case in which all the signals take on a same value. Case 2 is a case in which the value of the signal A is an error. Case 3 is a case in which the value of the signal B is an error. Case 4 is a case in which the value of the signal C is an error. Case 5 is a case in which the value of the signal D is an error. Case 6 is a case in which the values of two or more signals are errors (a case in which the value of the signal A and the value of the signal B are a first value, the value of the signal C and the value of the signal D are a second value, and the first value and the second value do not coincide with each other).

First, a case (case 1) in which all the signals take on a same value will be described.

The ratio of the comparison result indicating that the signals, a same value, coincide with each other (the comparison result marked with a circle in FIG. 4) to the comparison result indicating that the values of the signals do not coincide with each other (the comparison result marked with a cross in FIG. 4), the comparison results input to the error judgement circuit A300, is 3:0. Then, the error judgement circuit A300 judges that the value of the signal A is not an error, and outputs the judgement result. Likewise, the error judgement circuit B320, the error judgement circuit C340, and the error judgement circuit D360 respectively judge that the value of the signal B, the value of the signal C, and the value of the signal D are not errors, and output the judgement results.

In case 1, based on the judgement result of the error judgement circuit A300, the gate circuit A400 outputs the signal input via the signal line A100. That is, the judgement result output from the error judgement circuit A serves as an Enable signal of the gate circuit A400. Likewise, based on the judgement results of the error judgement circuits, the gate circuit B420, the gate circuit C440, and the gate circuit D460 output the signal B, the signal C, and the signal D, respectively.

Next, a case (case 2) in which only the signal A is an error will be described.

As shown in FIG. 4, the AB comparison result is the comparison result indicating that the value of the signal A and the value of the signal B do not coincide with each other. The AC comparison result and the AD comparison result are judgement results similar to the AB comparison result. In such a case, the error judgement circuit A300 judges that the value of the signal A does not coincide with other signals, and outputs a signal indicating that the value is an error.

Moreover, the BC comparison result is the comparison result indicating that the value of the signal B and the value of the signal C coincide with each other. The BD comparison result is the comparison result indicating that the value of the signal B and the value of the signal D coincide with each other. Therefore, the error judgement circuit B320 judges that the value of the signal B is not an error, and outputs a signal indicating that the value is not an error.

Likewise, the error judgement circuit C340 judges that the value of the signal C is not an error and outputs a signal indicating that the value is not an error, and the error judgement circuit D360 judges that the value of the signal D is not an error and outputs a signal indicating that the value is not an error.

Here, the signal output from the error judgement circuit A300, the signal indicating an error, does not turn on the gate circuit A400. Based on the signals of the error judgement circuit B320, the error judgement circuit C340, and the error judgement circuit D360, the signals indicating that the signals B to D are not errors, the gate circuit B420, the gate circuit C440, and the gate circuit D460 are turned on. Therefore, the signals B to D other than the signal A are input to the select circuit 500.

From the signals B to D thus input, the select circuit 500 selects a signal to be output and outputs the signal.

As described above, the error judgement circuits A300 to D360 can judge whether each signal is an error by majority decision based on the comparison results input thereto, and select a signal to be output from among the signals that are not judged to be errors.

Next, a case (case 6) in which the value of the signal A and the value of the signal B are a first value, the value of the signal C and the value of the signal D are a second value, and the first value and the second value do not coincide with each other will be described.

As shown in FIG. 4, the AB comparison result is the comparison result indicating that the value of the signal A and the value of the signal B coincide with each other, and the CD comparison result is the comparison result indicating that the value of the signal C and the value of the signal D coincide with each other. Other comparison results are the comparison results indicating that the values of the signals do not coincide with each other.

In such a case, the error judgement circuit A300 judges that the signal A is an error, and outputs a signal indicating an error. The error judgement circuit B320 judges that the signal B is an error, and outputs a signal indicating an error. Likewise, the error judgement circuit C340 and the error judgement circuit D360 output signals indicating an error.

As described above, in case 6, all the signals are judged to be errors. In such a case, since the error output generation circuit 10 cannot determine which signal takes on a correct value, a signal which is an error or a signal which is not an error, the select circuit 500 outputs an error signal.

The error signal allows the user to know the failure of an object.

3. Priority of Signal Line Selection

In addition, the output selection circuit 30 may select a signal line in accordance with priorities assigned to the signal lines and output a signal received via the selected signal line 100.

By doing so, the output selection circuit 30 can select a signal line in accordance with priorities from among the signal lines transmitting the signals which take on a same value and the number of which exceeds half of the number of the received signals, and output the signal received via the selected signal line.

In FIG. 4, it is assumed that, in the signal judgement circuit 1 of this embodiment, priorities are assigned in the following order: the signal line A>the signal line B>the signal line C>the signal line D.

In case 1, although the select 500 may select any one of the signal A, the signal B, the signal C, and the signal D because there is no signal judged to be an error, the select 500 selects the signal A in accordance with priorities and outputs the signal A. In case 2, the value of the signal A is judged to be an error, and the select circuit 500 selects the signal B in accordance with priorities from among the signal B, the signal C, and the signal D which are not judged to be errors, and outputs the signal B. In case 3, the value of the signal B is judged to be an error, and the select circuit 500 selects the signal A in accordance with priorities from among the signal A, the signal C, and the signal D which are not judged to be errors, and outputs the signal A. In case 4, the value of the signal C is judged to be an error, and the select circuit 500 selects the signal A in accordance with priorities from among the signal A, the signal B, and the signal D which are not judged to be errors, and outputs the signal A. In case 5, the value of the signal D is judged to be an error, and the select circuit 500 selects the signal A in accordance with priorities from among the signal A, the signal B, and the signal C which are not judged to be errors, and outputs the signal A. In case 6, the values of all the signals are judged to be errors, and the select circuit 500 outputs an error signal.

Figure 7:
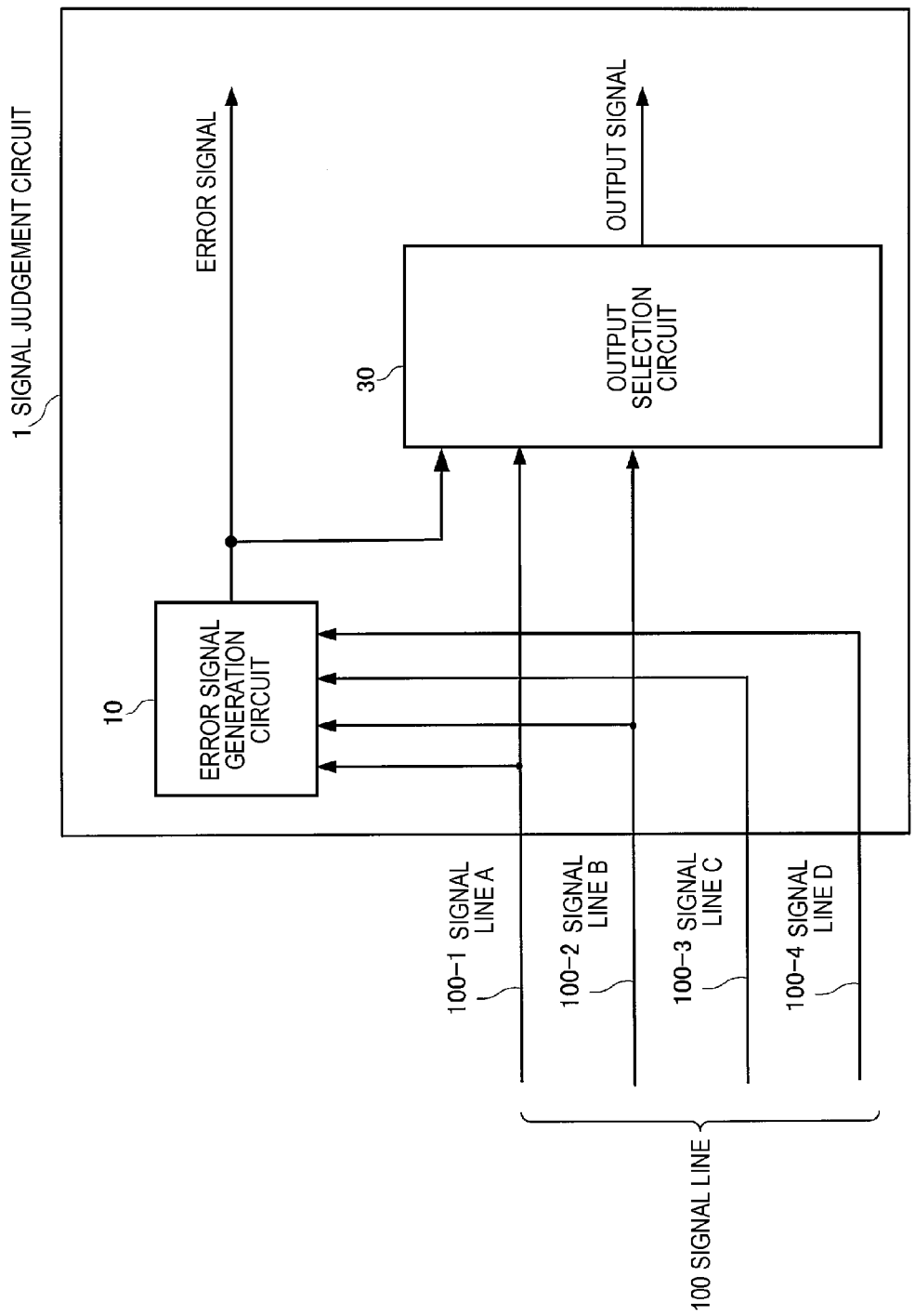
FIG. 7 is a diagram for explaining an example of a configuration of an embodiment of the signal judgement circuit.

As shown in FIG. 7, the signal judgement circuit 1 may be so configured that, of the signal lines 100, at least two given signal lines are connected to the output selection circuit 30, and the signals are input thereto via the given signal lines.

By doing so, even when there are four signal lines, connecting only the signal line A and the signal line B to the output selection circuit 30 will suffice by assigning priorities to the signal lines.

For example, only the signal line A100-1 and the signal line B100-2 are connected to the output selection circuit 30, and the signal line C100-3 and the signal line D100-4 may not be connected to the output selection circuit 30.

This makes it possible to reduce the number of the signal lines 100 connected to the output selection circuit 30. Thus, there is no need to complicate the circuit configuration as compared with when all the signal lines are connected to the output selection circuit 30, and it is possible to make the circuit scale small.

FIG. 5 is a diagram for explaining a selection method used when the output selection circuit 30 selects a signal line in accordance with priorities when a physically impossible error has occurred.

The physically impossible error refers to, for example, a case in which, due to noise or the like, the signal input via the signal line instantaneously takes on a value which is different from a value which the signal should normally take on.

Case 7 is a case in which the signal A or the signal B does not take on a correct value instantaneously. Case 8 is a case in which the signal A or the signal C does not take on a correct value instantaneously. Case 9 is a case in which the signal A or the signal D does not take on a correct value instantaneously. Case 10 is a case in which the signal B or the signal C does not take on a correct value instantaneously. Case 11 is a case in which the signal B or the signal D does not take on a correct value instantaneously. Case 12 is a case in which the signal C or the signal D does not take on a correct value instantaneously.

Hereinafter, case 7 will be described.

In case 7, if the value of the signal A is an error, the comparison results of the signals should be those of case 2. Moreover, if the value of the signal B is an error, the comparison results of the signals should be those of case 3. That is, as shown in FIG. 4, normally, there is no such a case in which only one of the comparison results input to the error judgement circuits A300 to D360 is different from the others.

However, as shown in FIG. 5, the comparison results of the signals in case 7 are the comparison results which are normally impossible.

In such a case, since it is impossible to decide which of the signal A and the signal B is an error, the select circuit 500 selects and outputs the signal C without outputting the signal A and the signal B. Incidentally, although the select circuit 500 may output the signal D, the select circuit 500 outputs the signal C in accordance with priorities.

In an error judgement, the error signal generation circuit 10 may output an error signal when combinations including each signal line contain a combination which does not have a same judgement result.

For example, as shown in FIG. 5, it may be judged to be an error when only one of the comparison results input to A300 to D360 is different from the others.

By doing so, even when the error signal generation circuit 10 outputs the error signal, the error signal generation circuit 10 can output the signal C.

Next, in case 8, the select circuit 500 selects and outputs the signal B in accordance with priorities.

Likewise, in case 9, the select circuit 500 selects and outputs the signal B in accordance with priorities. The same goes for cases 10, 11, and 12.

As described above, the error signal generation circuit 10 may output an error signal when combinations including each signal line contain a combination which does not have a same judgement result.

By doing so, even in a case which is not inherently treated as a failure, it is possible to output an error signal and prevent a signal corresponding to a combination which does not have a same judgement result from being used.

A case which is not inherently treated as a failure is, for example, an erroneous judgement made due to noise.

4. Example of a Detailed Configuration of the Signal Judgement Circuit

Figure 6:
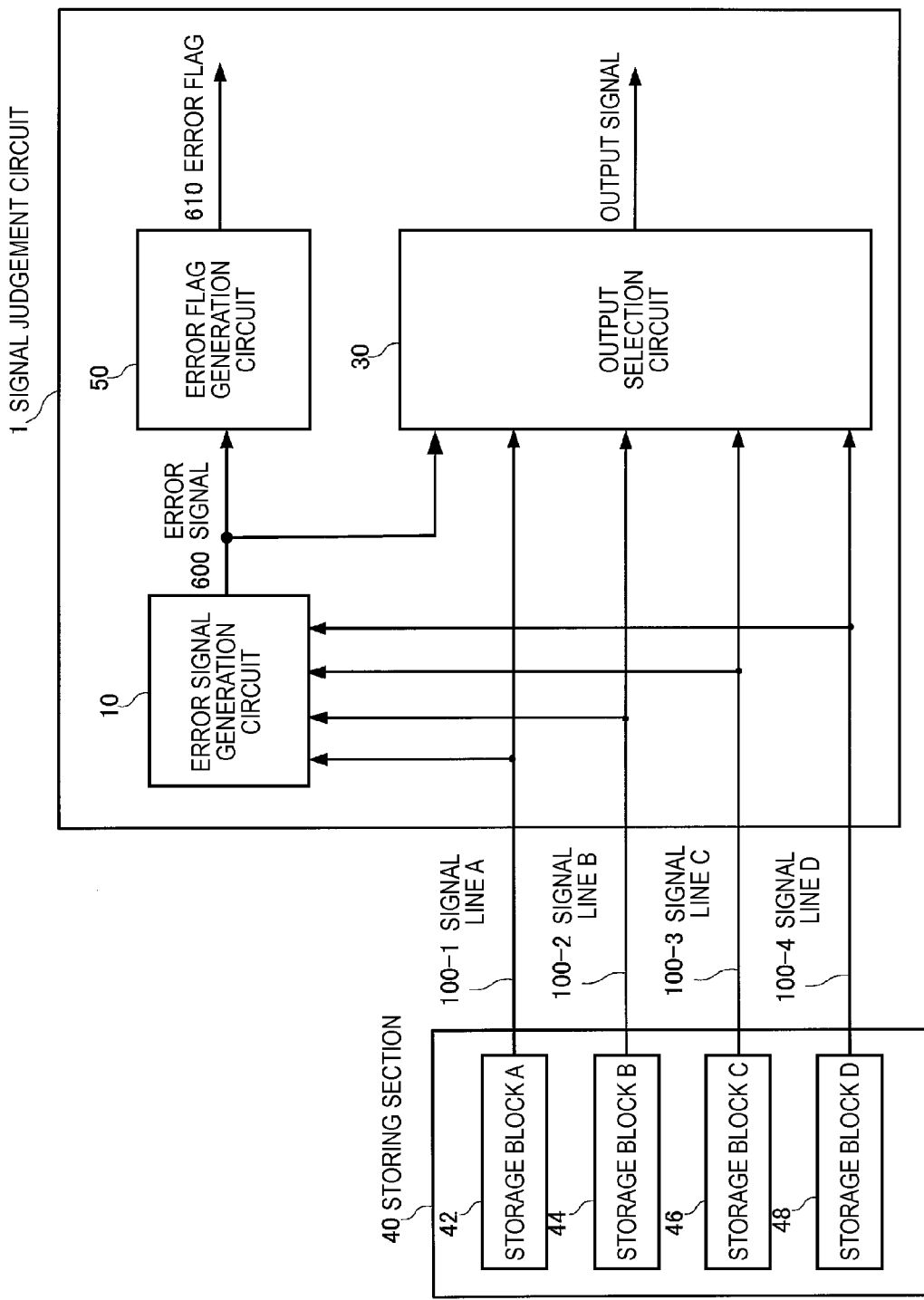
FIG. 6 is a diagram for explaining an example of a configuration of a more detailed embodiment of the signal judgement circuit.

FIG. 6 is a diagram for explaining an example of a configuration of a more detailed embodiment of the signal judgement circuit 1. Such components as are configured in the same manner as in counterparts in FIG. 1 are identified with the same reference numerals, and their explanations will be omitted.

The signal judgement circuit 1 of this embodiment may include a storing section 40 and an error flag generation circuit 50.

The storing section 40 may be provided inside or outside the signal judgement circuit 1.

The storing section may be formed as one storing section divided into at least four storage blocks which are storage areas. There may be at least four storing sections. Moreover, there may be at least two storing sections, each being divided into at least two storage areas.

An explanation will be given on the assumption that, as shown in FIG. 6, the storing section 40 is divided into at least four parts: a storage block A42, a storage block B44, a storage block C46, and a storage block D48. A signal may be output from each storage block via the signal line.

The storing section 40 may be a nonvolatile memory such as an EEPROM.

Same data may be stored in the storage blocks.

Each storage block may store predetermined data in a predetermined number of bits.

The error signal generation circuit 10 can detect a failure of the storing section by judging whether or not the signals from the storage blocks take on a same value.

Moreover, the error signal generation circuit 10 may receive the predetermined data stored in each storage block on a bit-by-bit basis via the signal line.

By doing so, the error signal generation circuit 10 can receive the data stored in each storage block one bit at a time via the signal line 100 at each reference clock, and output an error signal 600 when, of the received signals, the number of signals taking on a same value does not exceed half of the number of the received signals.

By doing so, the error signal generation circuit 10 can detect a failure of the storing section 40.

Moreover, the error flag generation circuit 50 may output an error flag 610 based on a change in an error signal in a predetermined period of time.

Figure 8:
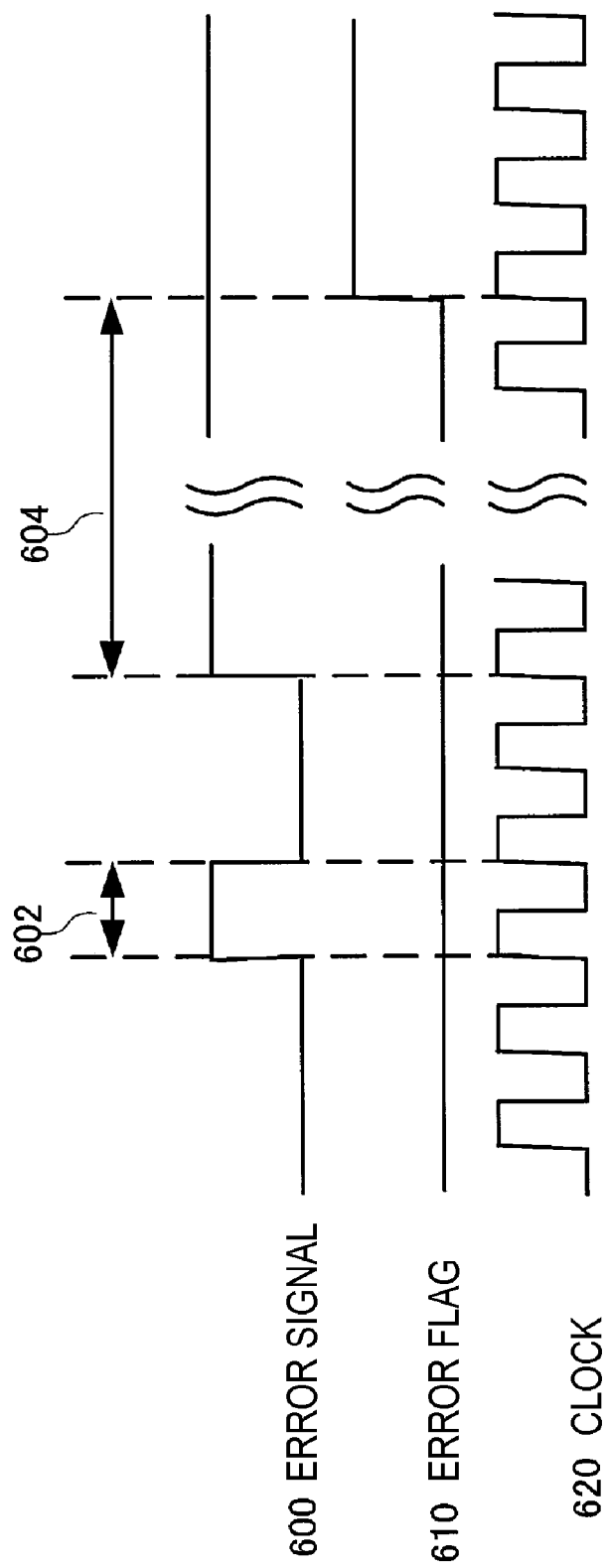
FIG. 8 is a diagram for explaining the relationship between an error signal and an error flag.

FIG. 8 is a diagram for explaining the relationship between an error signal and an error flag.

The relationship between the error signal 600 and the error flag 610 is shown. A clock 620 is a clock of a counter which does count so as to check the error signal 600 is being output for a predetermined period of time.

For example, the error flag generation circuit 50 may output the error flag 610 when the error signal 600 is being output during a predetermined number of clocks (an error signal output interval 604). In an error signal output interval 602, the error flag 610 is not output, and, in the error signal output interval 604, the error flag 610 is output.

By doing so, when a physically impossible error occurs, the error signal generation circuit 10 outputs the error signal 600, but the error flag generation circuit 50 does not output the error flag 610 because the error signal 600 output time is short (the error signal output interval 602).

In other words, when a physically impossible error occurs, the error flag is not set, making it possible to prevent false detection of errors.

5. Signal Judgement Circuit Test

Figure 9:
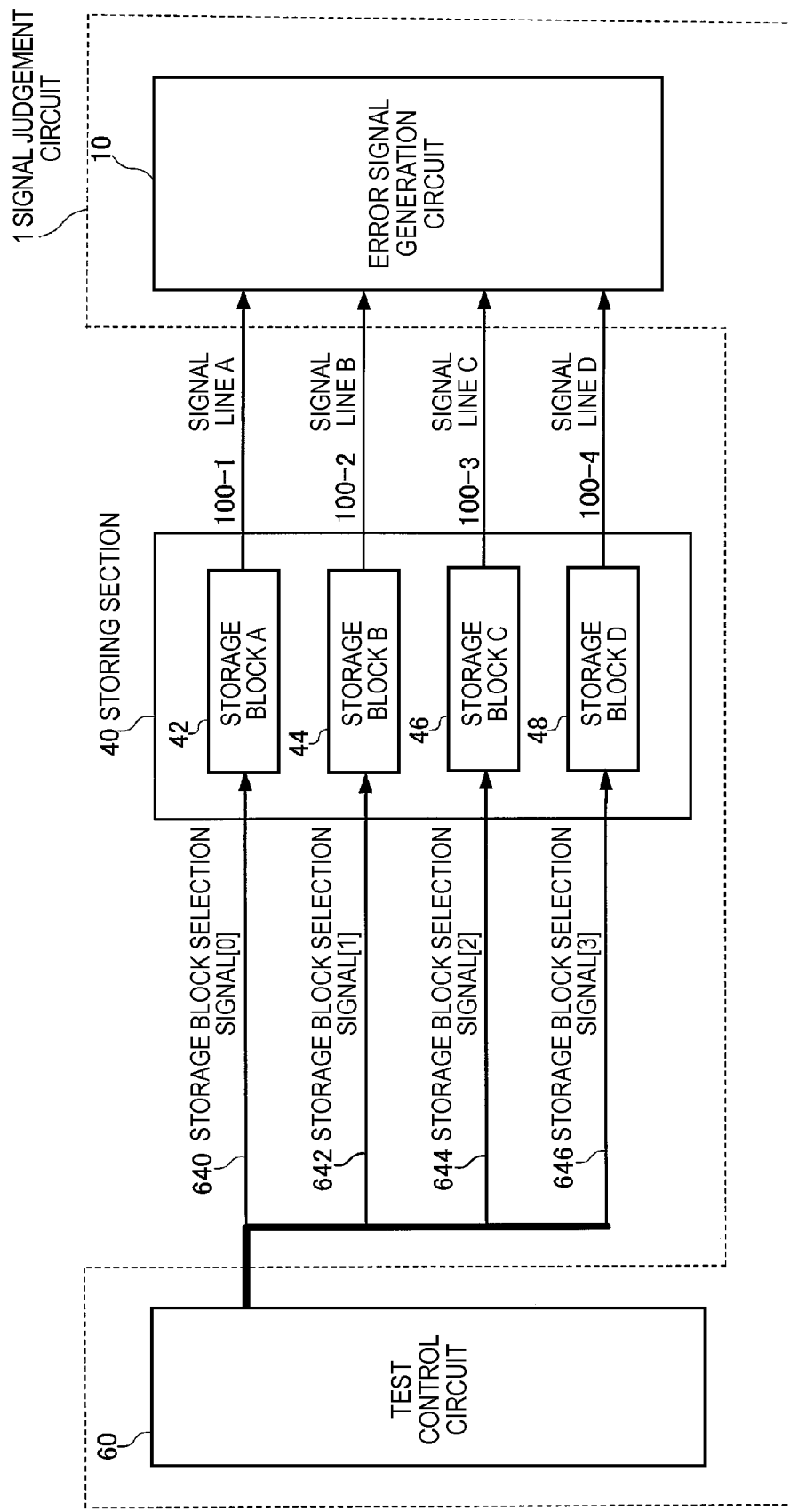
FIG. 9 is a diagram for explaining an example of a test method of an error signal generation circuit.

FIG. 9 is a diagram explaining an example of a test method of the error signal generation circuit 10.

Same data may be stored in the storage block A42, the storage block B44, the storage block C46, and the storage block D48.

The signal judgement circuit 1 of this embodiment may include a test control circuit 60.

The test control circuit 60 may perform control so that data which is different from the same data mentioned above is output to at least one of the signal lines A100-1 to D100-4, and the data stored in the storage blocks A42 to D48 is output to the other signal lines.

By doing so, as a result of data which is different from the same data stored in the storage blocks being output to at least one of the signal lines and the data stored in the storage blocks being output to the other signal lines, a test can be conducted on the error signal generation circuit 10 without preparing two types of signal lines input to the error signal generation circuit 10: a test signal line and a signal line outputting normal data.

The storage blocks may select and output data stored in the storage blocks A42 to D48 and given data which is different from the data stored in the storage blocks A42 to D48 based on storage block selection signals 640, 642, 644, and 646.

The storage block A42 is controlled by the storage block selection signal [0]640. The storage block B44 is controlled by the storage block selection signal [1]642. The storage block C46 is controlled by the storage block selection signal [2]644. The storage block D48 is controlled by the storage block selection signal [3]646.

The storage block selection signal may be output via a four-bit bus.

Figure 10:
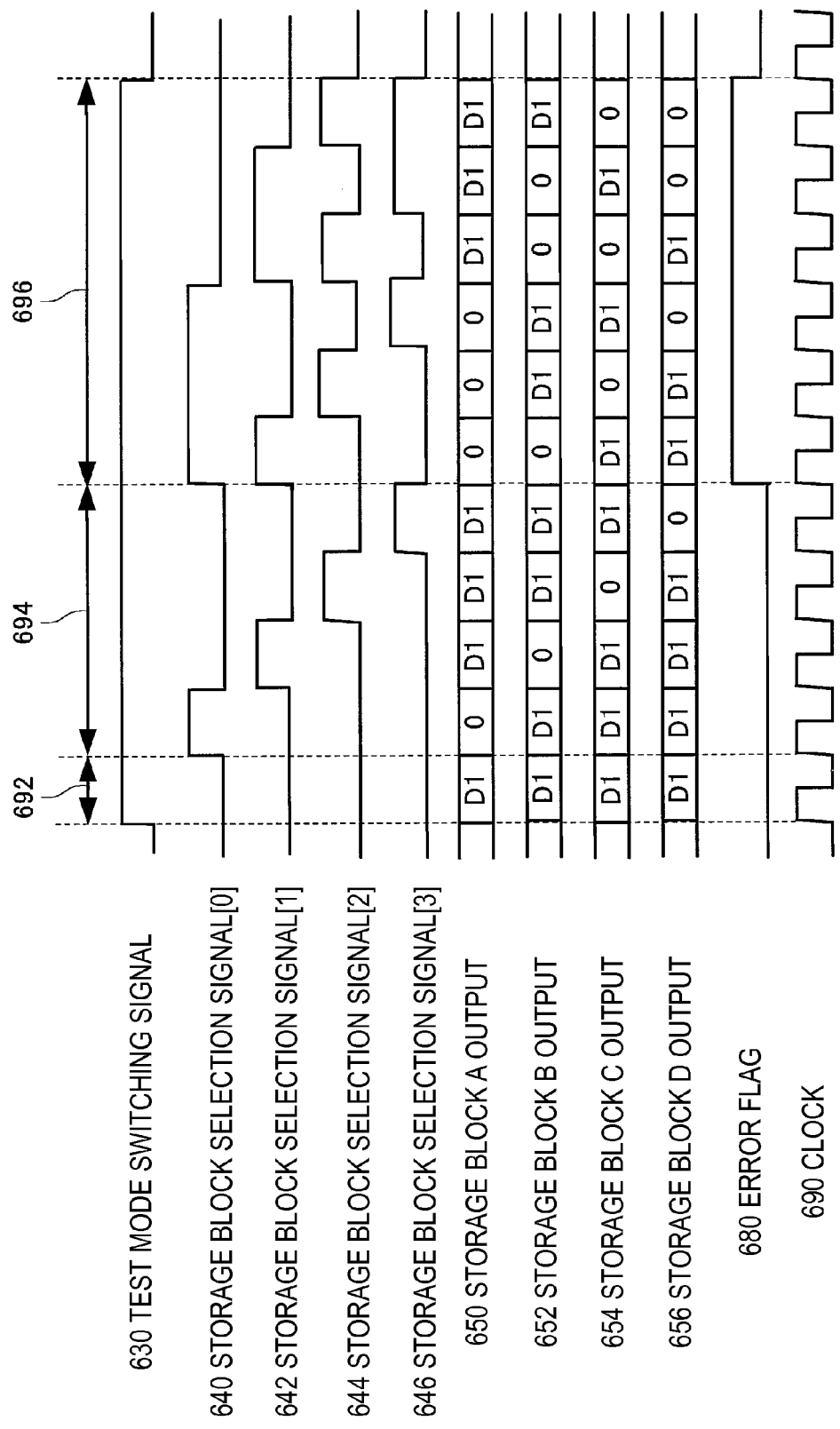
FIG. 10 is a timing chart for explaining the relationship between a storage block selection signal [3:0] and an output of a storage block.

FIG. 10 is a timing chart for explaining the relationship between a storage block selection signal [3:0] and an output of the storage block.

It is assumed to be in test mode when a test mode switching signal 630 is H.

An explanation will be given on the assumption that data D1 is stored in the storage blocks, for example.

The test control circuit 60 outputs, as a storage block selection signal, a signal when all four signals are L signals (an interval shown in 692 of FIG. 10), one of them is an H signal (an interval shown in 694 of FIG. 10), and two of them are H signals (an interval shown in 696 of FIG. 10).

When the storage block selection signal [0]640 is an L output, the storage block A42 is selected, and the storage block A42 outputs the stored data D1. When the storage block selection signal [0]640 is an H output, the storage block A42 is not selected, and the storage block A42 outputs a fixed value.

When the storage block selection signal [1]642 is an L output, the storage block B44 is selected, and the storage block B44 outputs the stored data D1. When the storage block selection signal [1]642 is an H output, the storage block B44 is not selected, and the storage block B44 outputs a fixed value.

When the storage block selection signal [2]644 is an L output, the storage block C46 is selected, and the storage block C46 outputs the stored data D1. When the storage block selection signal [2]644 is an H output, the storage block C46 is not selected, and the storage block C46 outputs a fixed value.

When the storage block selection signal [3]646 is an L output, the storage block D48 is selected, and the storage block D48 outputs the stored data D1. When the storage block selection signal [3]646 is an H output, the storage block D48 is not selected, and the storage block D48 outputs a fixed value.

By doing so, it is possible to control what is output from each storage block based on the storage block selection signal [3:0]. The test may be conducted every predetermined bits.

The test control circuit 60 may output a storage block selection signal in test mode in such a way that at least one storage block outputs given data.

In the interval shown in 692 of FIG. 10, since all the recording block selection signals [3:0] are L, the storage blocks output D1. Therefore, an error flag 680 does not become H.

In the interval shown in 694 of FIG. 10, since only one bit of the recording block selection signals [3:0] is H, only the storage block controlled by the storage block selection signal which has become H outputs a fixed value. For example, when only the storage block selection signal [0]640 is H, only the storage block A42 outputs 0, and the storage blocks B44 to D48 output D1. In such a case, since the ratio of the fixed value output to the D1 output is 1:3, the error signal generation circuit 10 does not judge it to be an error.

D1 is formed of predetermined bits and is data which does not correspond to given data (for example, the fixed value in this embodiment). Based on D1 and the given data, it is possible to conduct a test on the error signal generation circuit 10.

In the interval shown in 696 of FIG. 10, since any two bits of the recording block selection signals [3:0] are H, the storage blocks controlled by the storage block selection signals which have become H output a fixed value. For example, when the storage block selection signal [0]640 and the storage block selection signal [1] are H, the storage block A42 and the storage block B44 output a fixed value, and the storage block C46 and the storage block D48 output D1. In such a case, since the ratio of the fixed value output to the D1 output is 2:2, the error signal generation circuit 10 judges it to be an error.

By doing so, it is possible to conduct a test on the error signal generation circuit 10 by using the function of the storage block. This makes it possible to reduce the test circuits.

In addition, by doing so, it is possible to conduct a test on the error signal generation circuit 10 effectively with not much increase in the circuit scale.

6. Integrated Circuit Device

Figure 11:
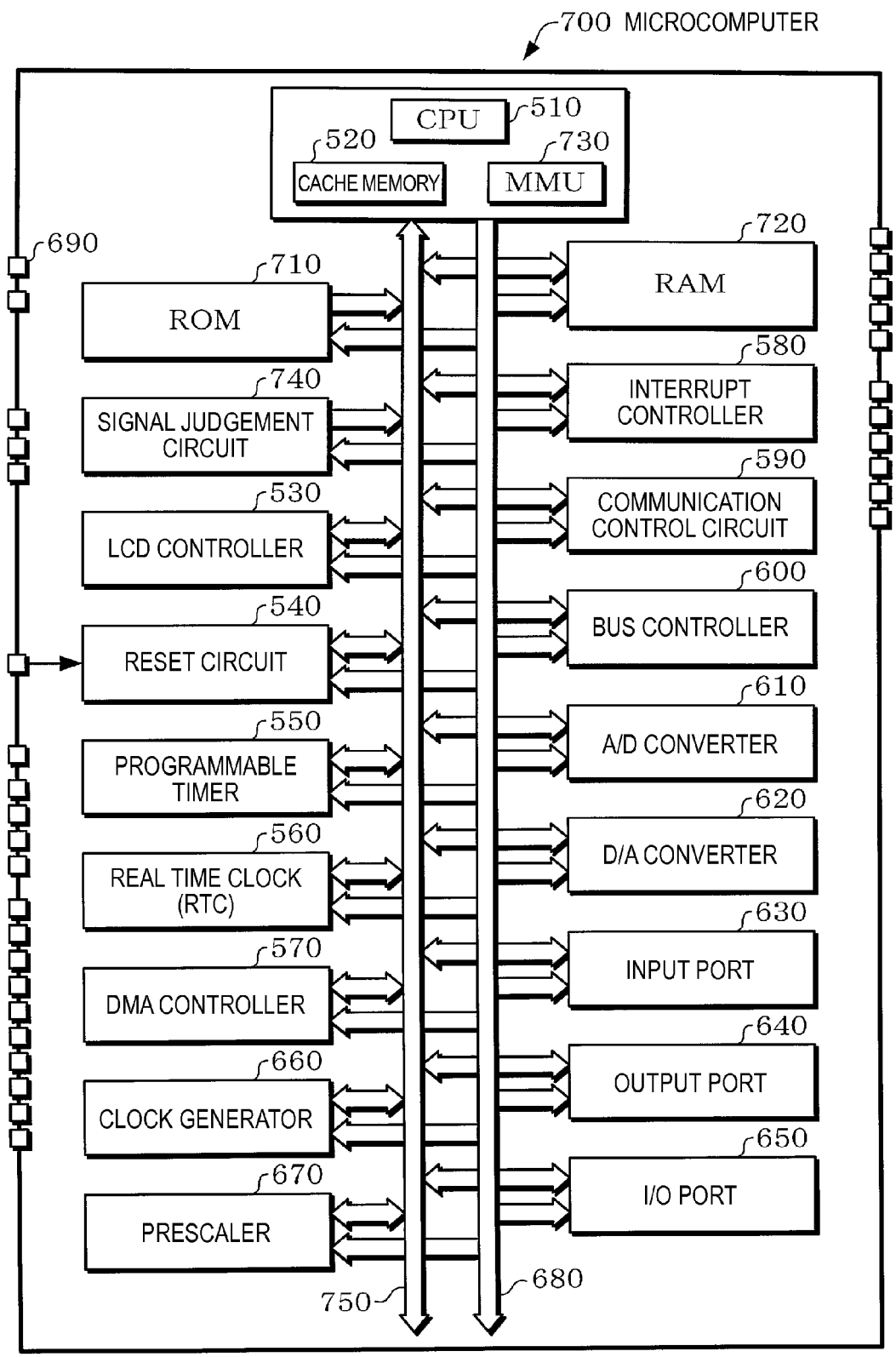
FIG. 11 is an example of a block diagram of an integrated circuit device of the embodiment.

FIG. 11 is an example of a block diagram of an integrated circuit device of this embodiment.

A microcomputer 700 includes a CPU 510, a cache memory 520, a ROM 710, a RAM 720, an MMU 730, an LCD controller 530, a reset circuit 540, a programmable timer 550, a real time clock (RTC) 560, a DMA controller 570, an interrupt controller 580, a communication control circuit 590, a bus controller 600, an A/D converter 610, a D/A converter 620, an input port 630, an output port 640, an I/O port 650, a clock generator 660, a prescaler 670, a signal judgement circuit 740, a general-purpose bus 680, a dedicated bus 750, and the like, which connect the above components, and various kinds of pins 690 or the like.

The signal judgement circuit 740 may be configured as described in FIGS. 1, 6, and 7.

7. Electronic Equipment

Figure 12:
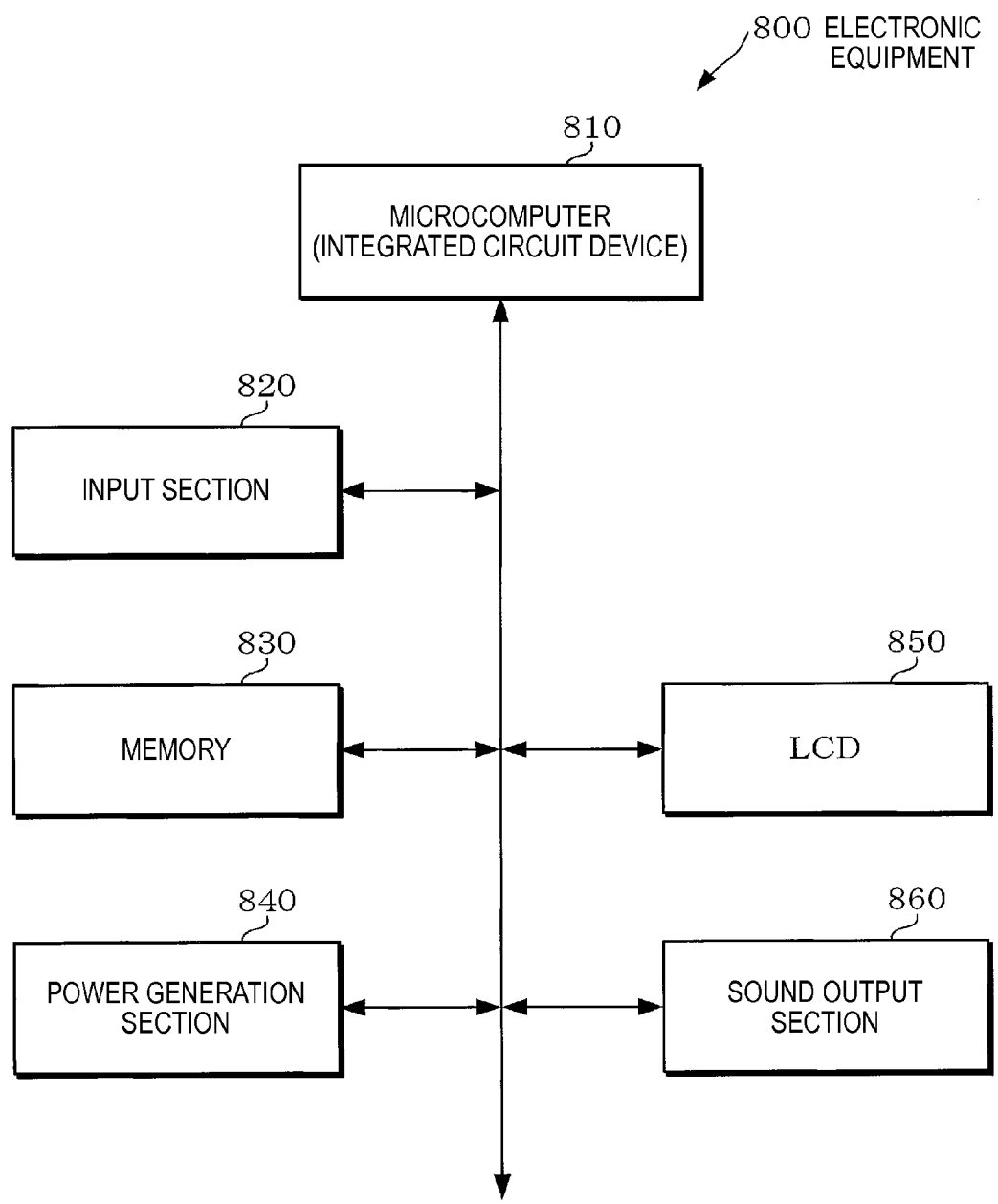
FIG. 12 is an example of a block diagram of electronic equipment including the integrated circuit device.

In FIG. 12, an example of a block diagram of electronic equipment of this embodiment is shown. Electronic equipment 800 includes a microcomputer (an integrated circuit device) 810, an input section 820, a memory 830, a power generation section 840, an LCD 850, and a sound output section 860.

Here, the input section 820 is provided for inputting various data. The microcomputer 810 performs various processing based on the data input by the input section 820. The memory 830 serves as a work area for the microcomputer 810 or the like. The power generation section 840 is provided for generating various types of power used in the electronic equipment 800. The LCD 850 is provided for outputting various kinds of images (characters, icons, graphics, etc.) displayed by the electronic equipment.

The sound output section 860 is provided for outputting various types of sound (audio, game sound, etc.) output by the electronic equipment 800, and the function thereof is realized by hardware such as a speaker.

Figure 13A:
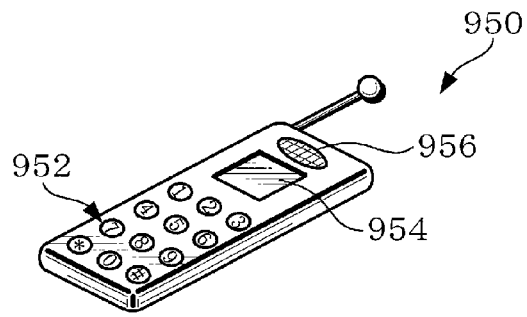
FIGS. 13(A) to 13(C) are examples of external views of various electronic equipment.

In FIG. 13(A), an example of an external view of a cellular telephone 950, which is one of the electronic equipment, is shown. The cellular telephone 950 is provided with a dial button 952 functioning as the input section, an LCD 954 displaying a telephone number, a name, an icon, or the like, and a speaker 956 functioning as the sound output section and outputting sound.

Figure 13B:
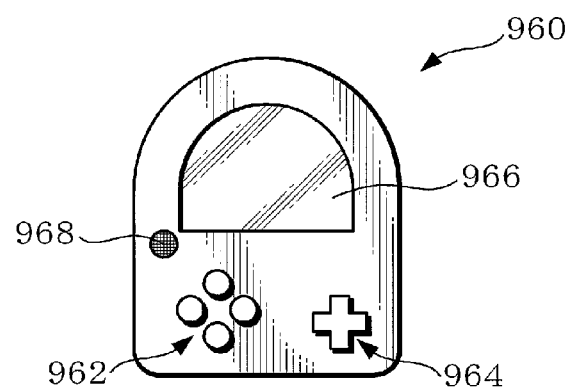

In FIG. 13(B), an example of an external view of a portable game machine 960, which is one of the electronic equipment, is shown. The portable game machine 960 is provided with an operation button 962 and an arrow key 964 which function as the input section, an LCD 966 displaying a game image, and a speaker 968 functioning as the sound output section and outputting game sound.

Figure 13C:
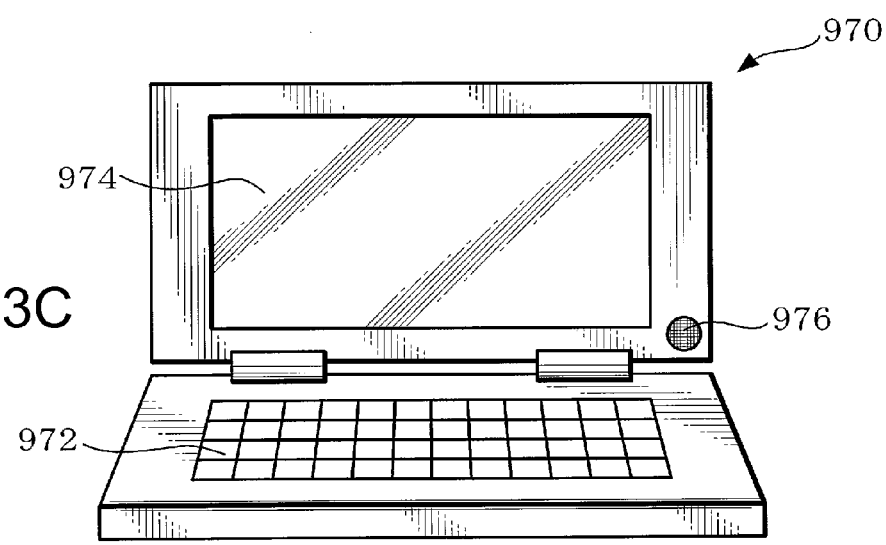

In FIG. 13(C), an example of an external view of a personal computer 970, which is one of the electronic equipment, is shown. The personal computer 970 is provided with a keyboard 972 functioning as the input section, an LCD 974 displaying characters, numerals, graphics, etc., and a sound output section 976.

By incorporating the integrated circuit device of this embodiment into the electronic equipment of FIGS. 13(A) to 13(C), it is possible to provide electronic equipment with improved redundancy and robustness in a short time.

Incidentally, the electronic equipment that can use this embodiment includes, in addition to those shown in FIGS. 13(A) to 13(C), various electronic equipment such as a handheld information terminal, a pager, an electronic desk calculator, a device with a touch panel, a projector, a word processor, a viewfinder-type or monitor direct-view-type video tape recorder, a car navigation system.

Incidentally, the present invention is not limited to the embodiment, and many modifications and variations are possible within the scope of the subject matter of the present invention.

The present invention includes a configuration which is substantially identical to the configuration described in the embodiment (for example, a configuration whose function, method, and results are identical to those of the configuration described in the embodiment or a configuration whose object and effects are identical to those of the configuration described in the embodiment). Moreover, the present invention includes a configuration in which a nonessential part of the configuration described in the embodiment is replaced by another part. In addition, the present invention includes a configuration that can obtain the same effect and working as those of the configuration described in the embodiment or a configuration that can achieve the same object as that of the configuration described in the embodiment. Furthermore, the present invention includes a configuration which is the configuration described in the embodiment, the configuration to which a well-known technique is added.

The invention claimed is:

1. A signal judgement circuit making a judgement on a signal, comprising:
    an error signal generation circuit receiving signals via at least four signal lines and outputting an error signal when, of all the received signals, the number of signals taking on a same value does not exceed half of the number of the received signals; and
    an output selection circuit selecting any one of the received signals and outputting the selected signal.

2. The signal judgement circuit according to claim 1, wherein
    the signal is a logic signal.

3. The signal judgement circuit according to claim 1, wherein
    the number of the signal lines is an even number.

4. The signal judgement circuit according to claim 1, wherein
    the output selection circuit selects the signal from the signal lines transmitting the signals which take on a same value and the number of which exceeds half of the number of the received signals, and outputs the signal.

5. The signal judgement circuit according to claim 4, wherein
    the output selection circuit selects the signal line in accordance with priorities assigned to the signal lines and outputs the signal received via the selected signal line.

6. The signal judgement circuit according to claim 1, wherein
    the error signal generation circuit makes a matching judgement on all combinations of the signal lines as to whether the values of the signals match, makes a judgement for each signal line as to whether the signal line is in error based on, of the combinations including each signal line, a type of a combination judged not to match, and outputs the error signal when the number of signal lines judged to be in error is equal to or greater than half of the number of the signal lines.

7. The signal judgement circuit according to claim 1, wherein
the error signal generation circuit outputs the error signal when combinations including each signal line contain a combination which does not have a same judgement result.

8. The signal judgement circuit according to claim 1, wherein
at least two given signal lines of the signal lines are connected to the output selection circuit, and the output selection circuit selects a signal input via any signal line of the given signal lines and outputs the signal.

9. The signal judgement circuit according to claim 1, comprising:
an error flag generation circuit outputting an error flag based on a change in the error signal in a predetermined period of time.

10. The signal judgement circuit according to claim 1, wherein
the signals are output from at least four storage blocks via the signal lines.

11. The signal judgement circuit according to claim 10, wherein
the error signal generation circuit receives the signal for each bit of data stored in the storage blocks and outputs the error signal when, of all the received signals, the number of signals taking on a same value does not exceed half of the number of the received signals.

12. The signal judgement circuit according to claim 11, wherein
same data is stored in the storage blocks, and
the signal judgement circuit comprises a test control circuit performing control so that given data is output to at least one of the signal lines and the data stored in the storage blocks is output to the other signal lines.

13. The signal judgement circuit according to claim 12, wherein
the test control circuit outputs, in a test mode, a storage block selection signal instructing at least one storage block to output the given data, and
each storage block selects and outputs data stored in the storage block and the given data which is different from the data stored in the storage block based on the storage block selection signal.

14. An integrated circuit device comprising the signal judgement circuit according to claim 1.

15. Electronic equipment comprising the integrated circuit device according to claim 14.

* * * * *